(12) United States Patent
Takita

(10) Patent No.: US 6,493,659 B1
(45) Date of Patent: Dec. 10, 2002

(54) POWER CONSUMPTION CALCULATING APPARATUS AND METHOD OF THE SAME

(75) Inventor: Isao Takita, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/321,879

(22) Filed: May 28, 1999

(30) Foreign Application Priority Data

May 29, 1998 (JP) .......................................... 10-150013

(51) Int. Cl.[7] .............................................. G06F 17/50
(52) U.S. Cl. ................... 703/14; 703/18; 716/4
(58) Field of Search ............................. 703/14, 16, 18; 716/4, 5

(56) References Cited

U.S. PATENT DOCUMENTS 5,831,868 A * 11/1998 Beausang et al. ........... 364/489
6,212,665 B1 * 4/2001 Zarkesh et al. ................. 716/4

FOREIGN PATENT DOCUMENTS

| JP | 2-136755 | 5/1990 |
|---|---|---|
| JP | 5-35812 | 2/1993 |
| JP | 5-126872 | 5/1993 |
| JP | 5-128192 | 5/1993 |
| JP | 5-165912 | 7/1993 |
| JP | 6-317616 | 11/1994 |
| JP | 8-314992 | 11/1996 |
| JP | 11-213019 | 8/1999 |

* cited by examiner

Primary Examiner—Kevin J. Teska
Assistant Examiner—Thai Phan
(74) Attorney, Agent, or Firm—McGinn & Gibb, PLLC

(57) ABSTRACT

A power consumption calculating apparatus includes a power consumption library unit storing a power consumption consumed in at least one logical primitive of a logic circuit at a time of transiting a state of the logical primitive in correspondence with an identifier provided for a combination of input signal states and a load capacitance; a logic circuit information storing unit storing information of a structure for the logical primitive and of a connection state between the logical primitives; a capacitance storing unit storing information for the load capacitance estimated in response to the logic circuit information; an input signal type storing unit storing information of input signal type in the logic circuit; a logical simulation unit carrying out a logical simulation with use of the logic circuit information and the input signal type information to determine state-transited information with the identifier used; and a power consumption calculating unit collecting the identifier obtained from a result of the logical simulation, determining a power consumption for the logical primitive with reference to the power consumption library unit in response to the state-transited information of the identifier and the load capacitance information, and summing the power consumption for at least the one logical primitive to determine a total power consumption of the logic circuit.

15 Claims, 10 Drawing Sheets

| out1 | in1 | in2 | in3 | ID |
|---|---|---|---|---|
| 1 | R | 1 | 1 | 0 |
| 1 | 1 | R | 1 | 1 |
| 1 | — | — | R | 2 |
| 0 | F | — | 0 | 3 |
| 0 | — | F | 0 | 4 |
| 0 | — | 0 | F | 5 |
| 0 | 0 | — | F | 6 |

Fig. 10 (a) (PRIOR ART)
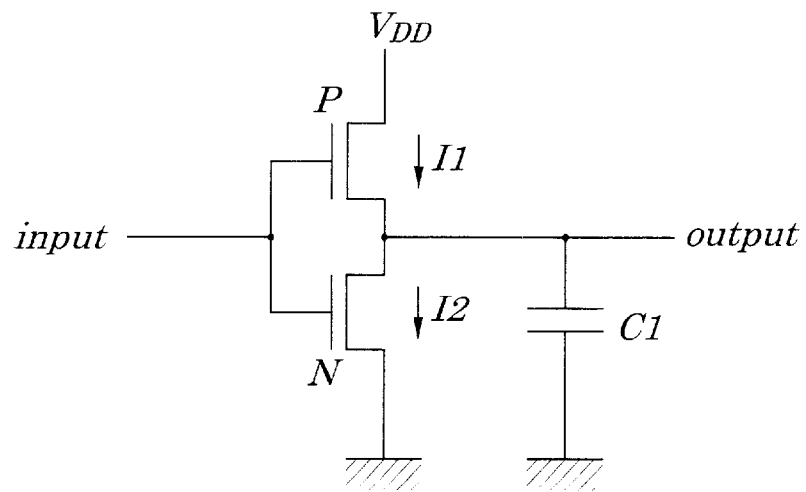
Fig. 10 (b) (PRIOR ART)
| input | P | N |
|-------|-----|-----|
| L | ON | OFF |
| H | OFF | ON |
Fig. 10 (c) (PRIOR ART)
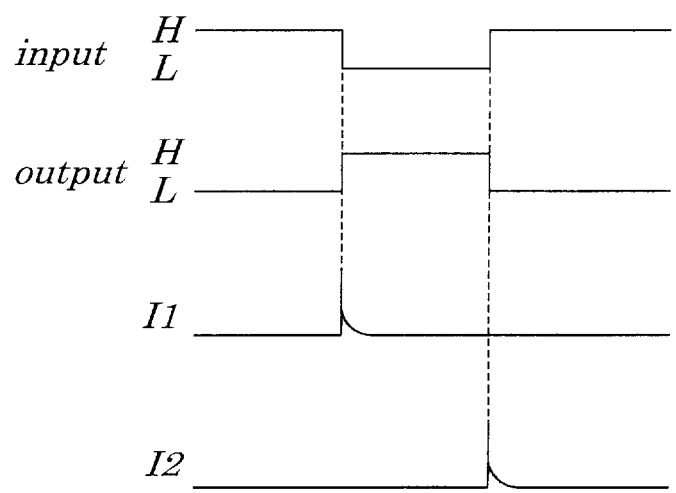

US 6,493,659 B1

POWER CONSUMPTION CALCULATING APPARATUS AND METHOD OF THE SAME

BACKGROUND OF THE INVENTION

1. Field of the Invention

The present invention relates to a power consumption calculating apparatus and method of the same using a logical simulation. More specifically, it relates to a power consumption calculating apparatus and method of calculating the power consumption for calculating the power consumption consumed in a CMOS (Complementary Metal Oxide Semiconductor) circuit in accordance with toggle information obtained from the logical simulation.

2. Description of the Related Art

Before manufacturing a semiconductor integrated circuit on a manufacturing line, estimation of power consumption consumed in the integrated circuit is carried out with use of a logical simulation to ensure that the power consumption should be within a design value. Such estimation of power consumption is known in the field of circuit design produced by CAD (Computer Aided Design) system when producing an integrated circuit, which has been proposed by a Japanese Patent Application Laid-open No. Hei5-128192.

In such case of the gazette, power consumption information is previously provided for each of the cells constituting an integrated circuit so that it corresponds to combination of input signals in relation to the integrated circuit. A logical simulation is applied to the combination of input signals to thereby obtain state-transited information of the signals. The power consumption corresponding to the state-transited information is then calculated with reference to the previously provided power consumption information.

In this case, the state-transited information means that a signal level on an input pin emerges simply on what its value becomes at a certain time. In the power consumption calculating method described in the gazette, the power consumption is obtained from the previously provided power consumption information at every certain period of time. This power consumption is then added up to as a total value when adding the power consumption for each of the cells in accordance with the state transition of input signals.

However, the variation of input signals inputted to the cells is no consideration how the signals are altered to one after another at every period of time. Therefore, the power consumption for each of the cells should be constant while the state transition of input signals is made continuous for a certain period of time.

In consideration of the power consumption consumed in CMOS circuit, FIG. 10(a) is a circuit diagram for explaining the power consumption in a CMOS circuit which constitutes an inverter having a P-channel transistor P and an N-channel transistor N. The transistors P and N produce a state-transited information such as On and Off states in response to a high (hereinafter, abbreviated to H) level and low (hereinafter, abbreviated to L) level emerged on an input, as shown in FIG. 10(b).

As also shown in FIG. 10(c), an output of the inverter is altered from the L to H state when the input state is altered from the H to L state. At this time, with an altered current I1 altered into an output-connected load capacitor C1 from a power source $V_{DD}$, the power consumption is produced in the transistor P due to an internal resistance. After terminating the alteration into the load capacitor C1, the power consumption can be neglected since the current flown from the power source $V_{DD}$ is extremely small.

While the input is altered from the L to H state, the output is altered to the H to L state. At this time, a current is not flown from the power source $V_{DD}$, but, with a discharged current I2 discharged from load capacitor C1 to a ground, the power consumption is produced in transistor N due to internal resistance. After terminating the discharge of load capacitor C1, the power consumption can also be neglected due to a small current flown from the power source $V_{DD}$.

As described above, in the case where an integrated circuit is made up of CMOS circuit, the value of power consumption is not constant while the state of input signal is made continued. That is, the power consumption is mostly emerged at altering the state transition of the input, but it is extremely small in steady state.

Thus, the power consumption consumed in the CMOS circuit is proportional to frequency for the state transition of input (or output) or its operating frequency. The power consumption calculating method by the gazette may therefore result in a case where the power consumption is not dependent on the frequency in principle since it is constant while the state transition of input signal is made continued.

SUMMARY OF THE INVENTION

It is therefore an object of the present invention to provide a power consumption calculating apparatus and method of the same capable of calculating the power consumption consumed in an integrated circuit made up of CMOS device with use of a logical simulation.

According to a first aspect of the present invention, there is provided a power consumption calculating apparatus, including: a power consumption library unit storing a power consumption consumed in at least one logical primitive constituting a logic circuit at a time of transiting a state of the logical primitive in correspondence with an identifier provided for a combination of input signal states emerged on the logical primitive and a load capacitance for the logical primitive; a logic circuit information storing unit storing information of a structure for the logical primitive and a connection state between the logical primitives in the logic circuit; a capacitance storing unit storing information for the load capacitance of the logical primitive estimated in response to the logic circuit information; an input signal type storing unit storing information of an input signal type in the logic circuit; a logical simulation unit carrying out a logical simulation with use of the logic circuit information and the input signal type information to determine state-transited information in the logical primitive with the identifier used; and a power consumption calculating unit collecting the identifier obtained from a result of the logical simulation for the logical primitive constituting the logic circuit, determining a power consumption for the logical primitive with reference to the power consumption library unit in response to the state-transited information of the identifier and the load capacitance information, and summing the power consumption for at least the one logical primitive to determine a total power consumption of the logic circuit.

The logic circuit may include a plurality of logical primitives.

The logical primitive may include a logic device made up of a CMOS circuit.

The load capacitance may be estimated from an output wiring capacitance of the logical primitive and an input terminal capacitance of logical primitives in succeeding stages.

The load capacitance may be estimated for arbitrary number of stages in a plurality of logical primitives.

The power consumption calculating unit may determine the power consumption for the state-transited information obtained from a result of the logical simulation, thereafter, may determine the power consumption for each time interval of an arbitrary time series different from a time series of the state-transited information in accordance with the result of the power consumption calculation.

The power consumption calculating apparatus may further include, a library unit determining the power consumption for at least one logical primitive at a time of transiting the input signals inputted to the logical primitive constituting a logic circuit to store the power consumption in correspondence with state transitions of the input signals; and a power consumption summing unit identifying the state transition of the input signal inputted to the logical primitive in accordance with a result of logical simulation in the logic circuit, reading out the power consumption from the library means, and determining the power consumption for the logical primitive to sum up the determined power consumption for the logic circuit.

According to a second aspect of the present invention, there is provided a power consumption calculating method, including the steps of: (a) providing a power consumption library unit for storing a power consumption consumed in at least one logical primitive constituting a logic circuit at a time of transiting a state of the logical primitive in correspondence with an identifier provided for a combination of input signal states emerged on the logical primitive and a load capacitance for the logical primitive; (b) determining previously load capacitance information for the logical primitive estimated from information of a structure of the logical primitive and of connection state of the logical primitive in the logic circuit; (c) carrying out a logical simulation with use of the logic circuit information and the input signal type information to determine state-transited information in the logical primitive with the identifier used; (d) collecting the identifier obtained from a result of the logical simulation for the logical primitive constituting the logic circuit; (e) determining a power consumption for the logical primitive with reference to the power consumption library unit in response to the state-transited information of the identifier and the load capacitance information, and (f) summing the power consumption for at least the one logical primitive to determine a total power consumption of the logic circuit.

The power consumption calculating method may further include the steps of: (a1) determining previously a power consumption for at least one logical primitive at a time of transiting input signals inputted to the logical primitive constituting a logic circuit to store the power consumption in a library in correspondence with the state transition of the input signals; (b1) identifying the state transition of the input signal inputted to the logical primitive in accordance with a result of a logical simulation in the logic circuit; and (c1) reading out the power consumption corresponding to the state transition from the library, determining the power consumption for the logical primitive, and determining the power consumption of the logic circuit in accordance with the power consumption determined for at least the one logical primitive.

According to the constitution and method of power consumption calculation described above, the power consumption consumed in an integrated circuit made up of CMOS device can be determined by the logical simulation.

BRIEF DESCRIPTION OF THE DRAWINGS

The above and other objects, advantages and features of the present invention will be more apparent from the following description taken in conjunction with the accompanying drawings in which:

FIG. 10(a) is a circuit diagram showing a CMOS circuit;

FIG. 10(b) is a table showing a state transition; and

FIG. 10(c) is a time chart diagram showing waveforms of an input and output of the CMOS circuit.

DESCRIPTION OF THE PREFERRED EMBODIMENTS

Hereinafter, embodiments of the present invention will be described with reference to the drawings.

Figure 1:
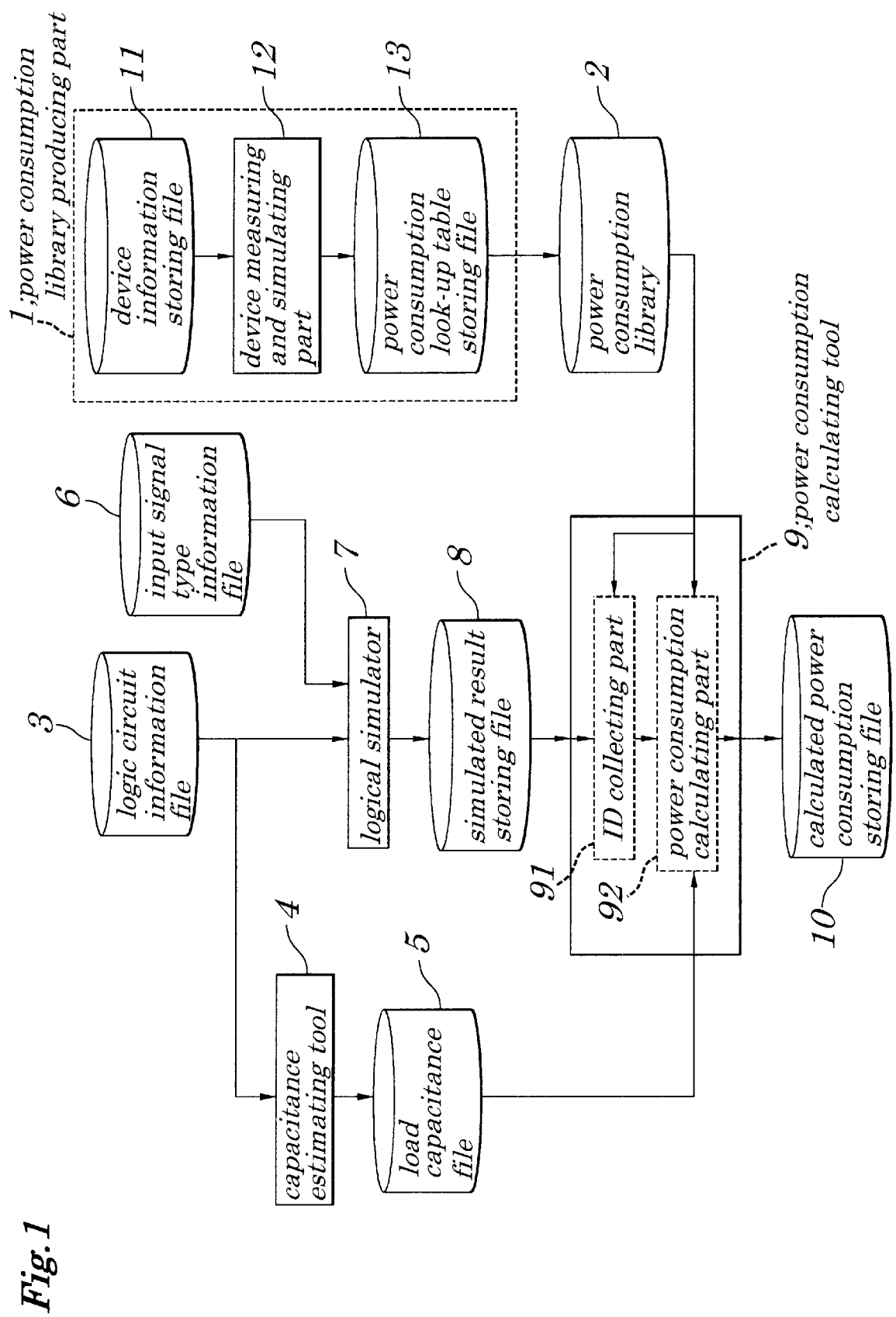
FIG. 1 is an electronic block diagram showing a power consumption calculating apparatus of an embodiment in the present invention.
Figure 2:
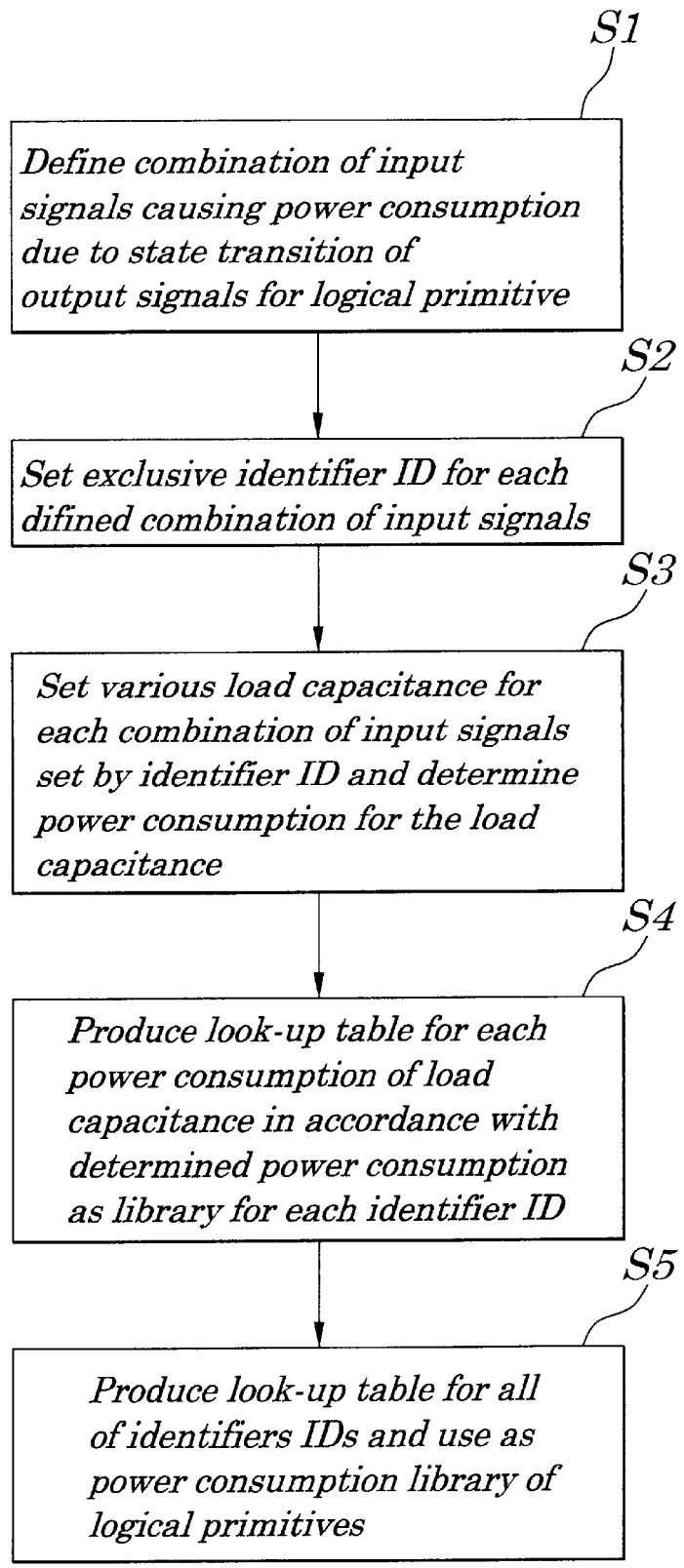
FIG. 2 is a flow chart showing a method of producing a power consumption library.
Figure 3:
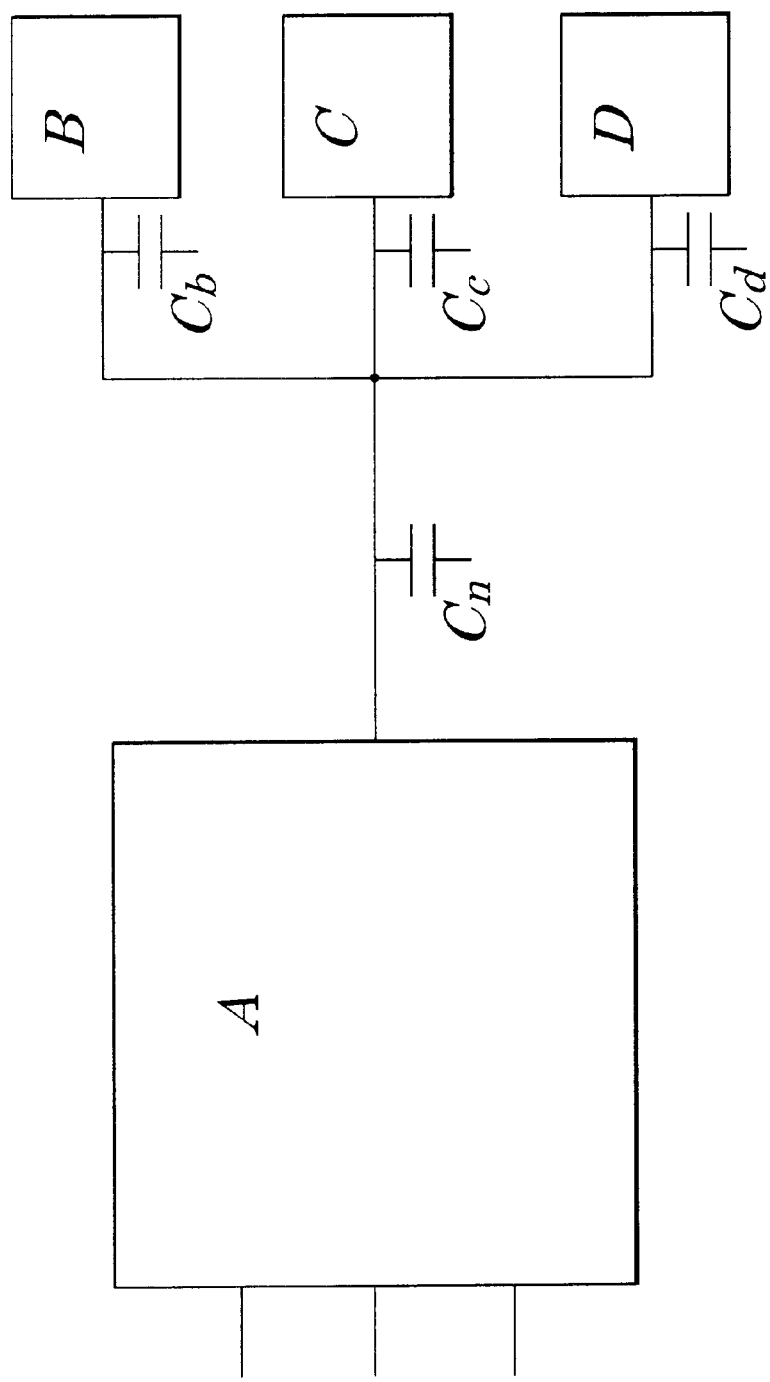
FIG. 3 is a circuit diagram for explaining a power consumption calculating model for a logical primitive.
Figure 4:
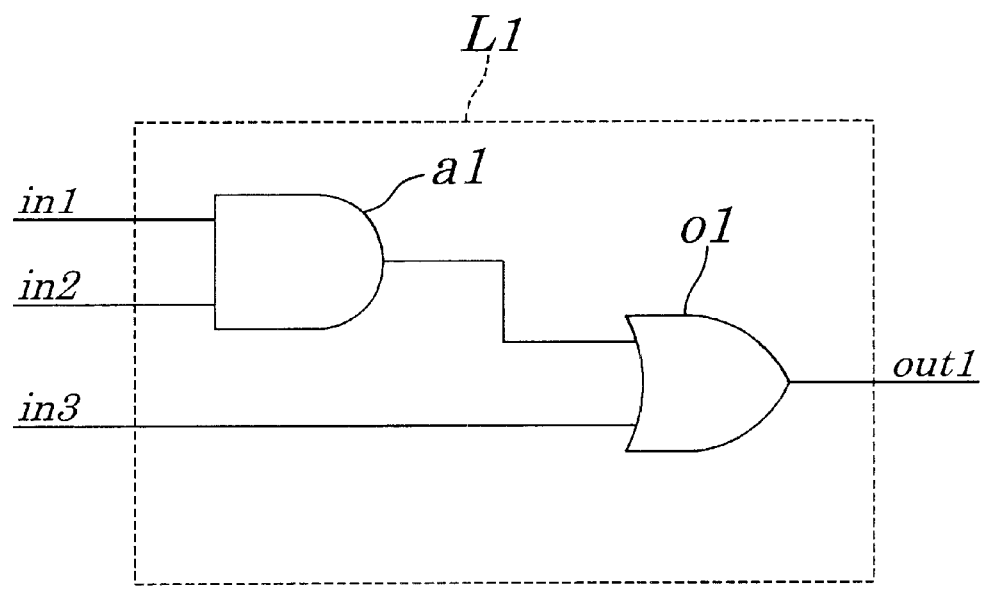
FIG. 4 is a circuit diagram for explaining the influence of internal load on the power consumption of logical primitive.
Figure 5:
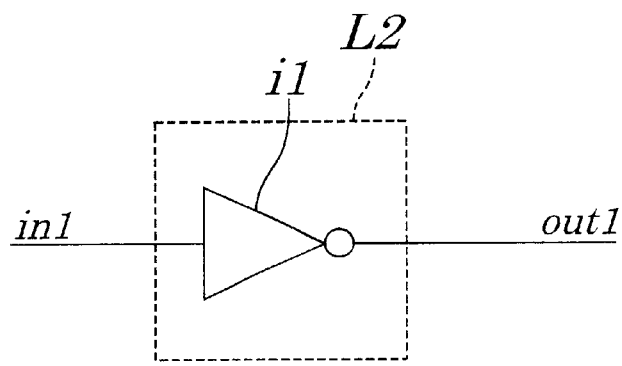
FIG. 5(a) is a circuit diagram showing an inverter as a logical primitive.
FIG. 5(b) is a graph showing a power consumption to load capacitance curve used for producing a look-up table of the logical primitive shown in FIG. 5(a)
Figure 5:
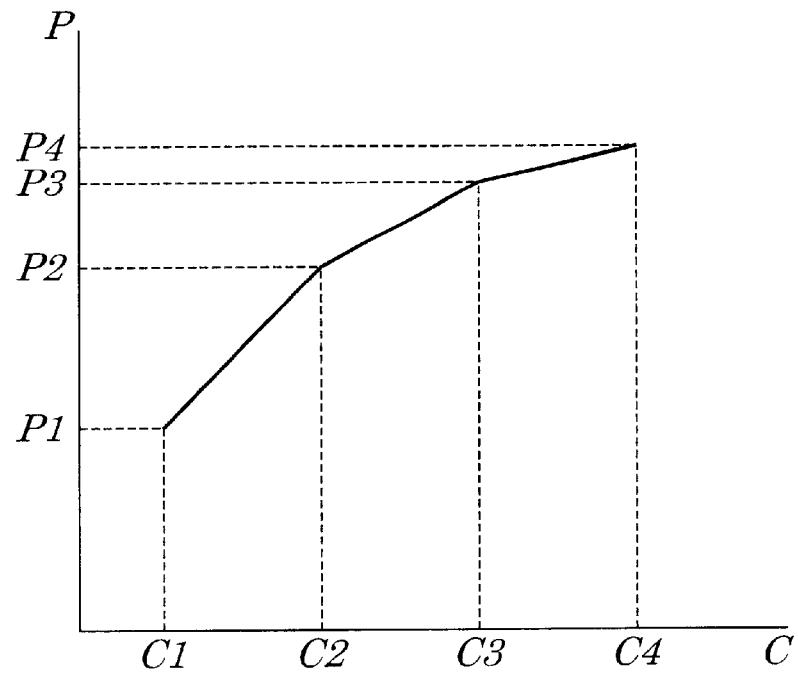
Figure 6:
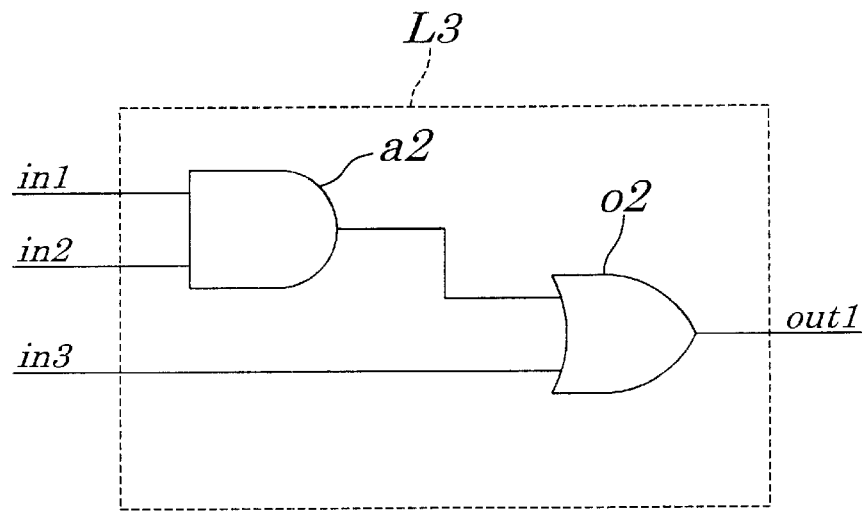
FIG. 6(a) is a circuit diagram showing an AND gate and OR gate as a logical primitive.
FIG. 6(b) is a table showing input and output state transition used for producing a look-up table of the logical primitive shown in FIG. 6(a)
Figure 7:
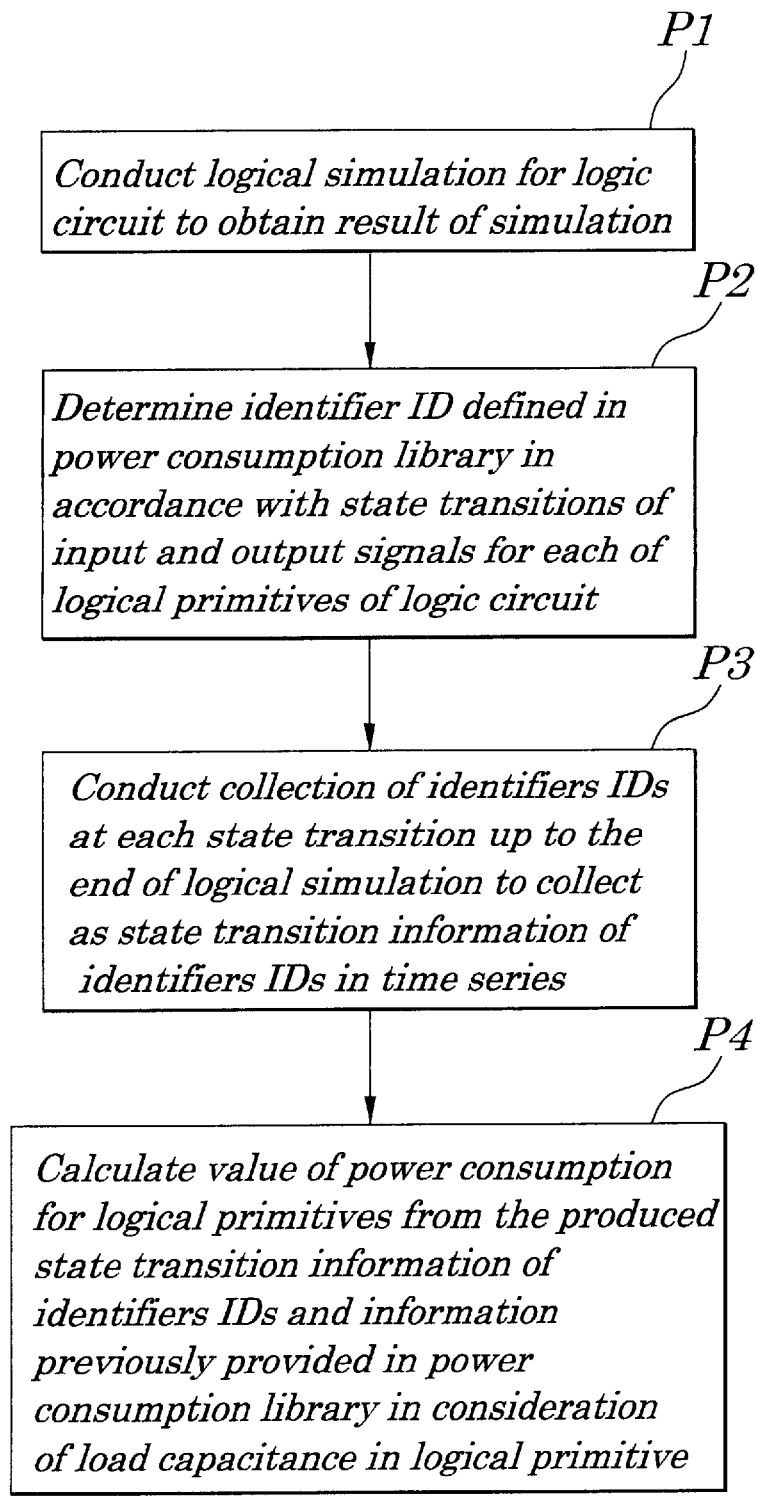
FIG. 7 is a flow chart showing a power consumption calculating method.
Figure 8:
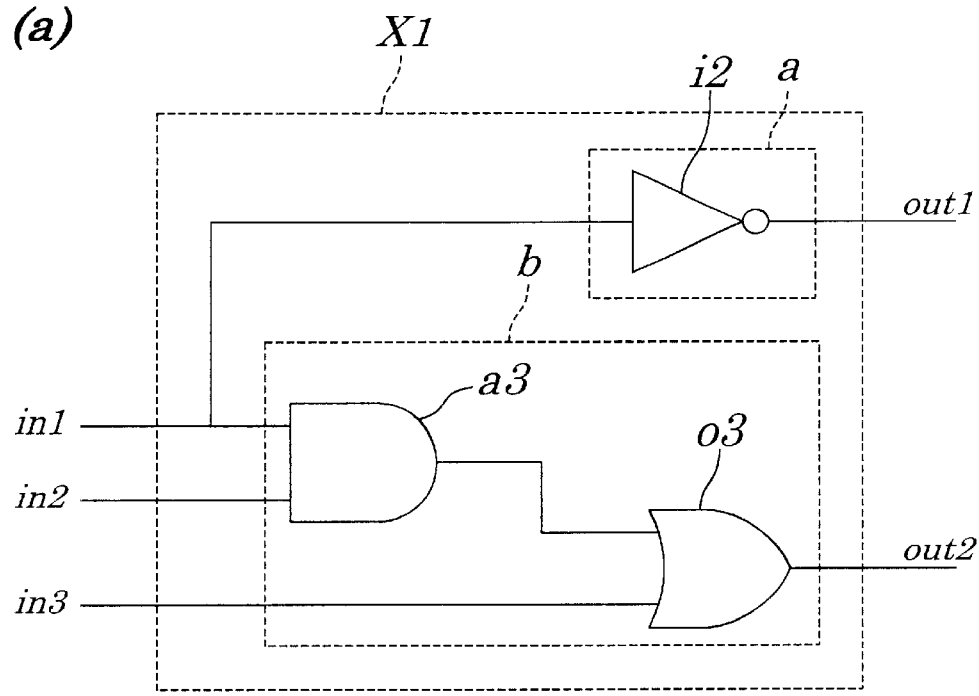
FIG. 8(a) is a circuit diagram showing two logical primitives.
FIG. 8(b) is a time chart diagram showing waveforms of inputs and outputs used for calculating power consumption of the two logical primitives shown in FIG. 8(a)
Figure 8:
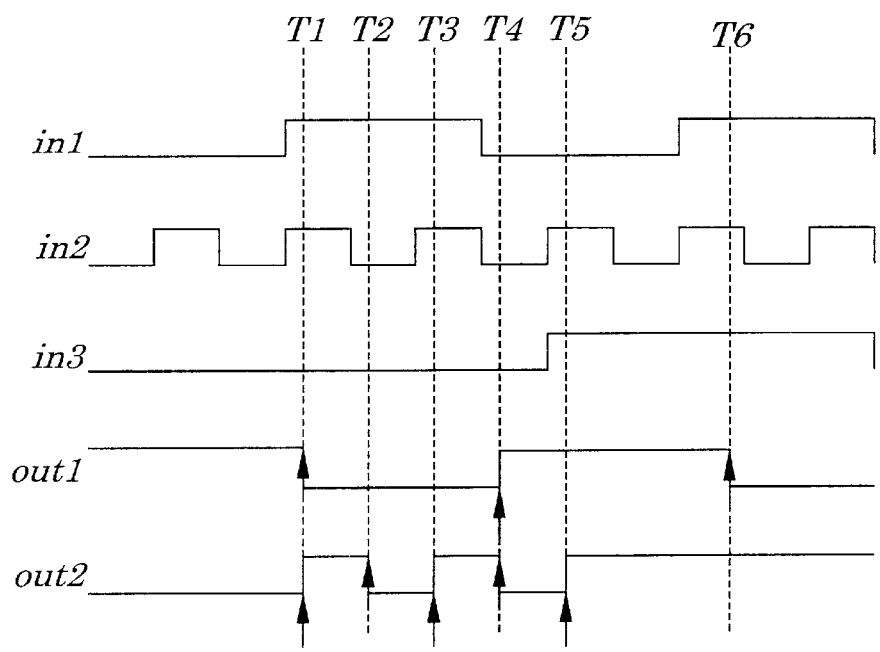

A power consumption calculating apparatus in the present invention is shown in FIG. 1 illustrated as an electronic block diagram. A method of producing a power consumption library is shown in FIG. 2 illustrated as a flow chart. A power consumption calculating model for a logical primitive is shown in FIG. 3 illustrated as a circuit diagram. Influence of an internal load on the power consumption for a logical primitive will be explained with reference to FIG. 4 illustrated as a circuit diagram. An inverter as a logical primitive is shown in FIG. 5(a) illustrated as a circuit diagram. A power consumption to load capacitance curve is shown in FIG. 5(b) illustrated as a graph used for producing a look-up table of the logical primitive shown in FIG. 5(a). An AND gate and OR gate as a logical primitive are shown in FIG. 6(a) illustrated as a circuit diagram. Input and output state transition is shown in FIG. 6(b) illustrated as a table used for producing a look-up table of the logical primitive shown in FIG. 6(a). A power consumption calculating method is shown in FIG. 7 illustrated as a flow chart. Two logical primitives are shown in FIG. 8(a) illustrated as a circuit diagram. Waveforms of inputs and outputs are shown in FIG. 8(b) illustrated as a time chart used for calculating the power consumption of two logical primitives shown in FIG.

Figure 9:
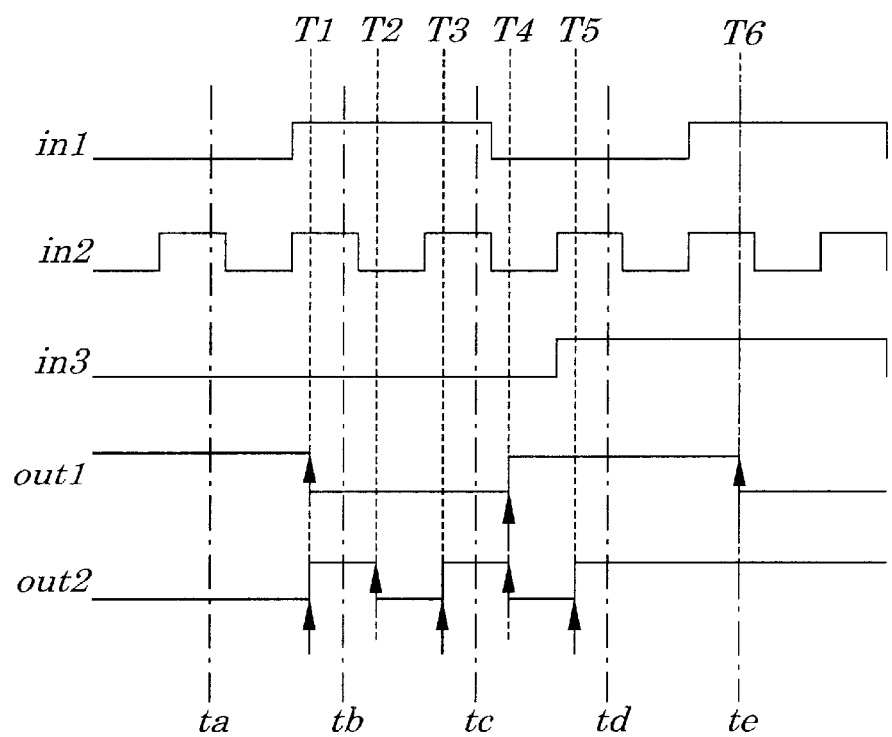
FIG. 9 is another time chart diagram showing waveforms of inputs and outputs used for calculating the power consumption of the two logical primitives shown in FIG. 8(a)

8(a). Other waveforms of inputs and outputs are shown in FIG. 9 illustrated as another time chart used for calculating the power consumption of the two logical primitives shown in FIG. 8(a).

Referring to FIG. 1, the power consumption calculating apparatus is substantially constituted of a power consumption library producing part 1, a power consumption library 2, a logic circuit information file 3, a capacitance estimating tool 4, a load capacitance file 5, an input signal type information file 6, a logical simulator 7, a simulated result storing file 8, a power consumption calculating tool 9, and a calculated power consumption storing file 10.

The power consumption library producing part 1 is also constituted of a device information storing file 11 for storing information of a practical device or device model of a logical primitive, a device measuring and simulating part 12 for measuring a device characteristic and simulating the device characteristic specified by the logical primitive, and a power consumption look-up table storing file 13 for storing a table indicating power consumption corresponding to a load capacitance value at arbitrary number of stages in the logical primitive and at every identifier ID indicative of a combination of input signals inputted to the logical primitive. The power consumption library 2 stores a power consumption look-up table having all identifiers IDs each corresponding to the load capacitance values for each of the logical primitives in a logic circuit.

The logic circuit information file 3 stores information of the logical primitives in the logic circuit and information of those connecting states. The capacitance estimating tool 4 estimates a load capacitance at each of plural stages including a wiring capacitance at output side of the logical primitive and an input terminal capacitance at the preceding stage of logical primitive. The load capacitance file 5 stores the load capacitance value, at every logical primitive, estimated by the capacitance estimating tool 4. The input signal type information file 6 stores information of input signal type emerged on the input terminals or pins at every logical primitive. The logical simulator 7 determines toggle information, at every identifier ID, indicative of a state transition corresponding to the input signal type for each of the logical primitives. The simulated result storing file 8 stores the toggle information, at every identifier ID, for each of the logical primitives corresponding to the input signal type.

The power consumption calculating tool 9 is constituted of an ID collecting part 91 for collecting the toggle information in response to the input signal type for each of the logical primitives constituting the logic circuit, and a power consumption calculating part 92 for determining a value of power consumption with reference to the power consumption library 2 in accordance with the collected identifier ID and the value of estimated load capacitance for each of the logical primitives and summing the power consumption determined for each of the logical primitives to thereby determine a total power consumption for the entire logic circuit.

Operation of the power consumption calculating apparatus will be described with reference to FIGS. 1 to 9. In this case, a certain conception such as a logical primitive is employed to represent the operation in each part of the logic circuit, when the power consumption of a logic circuit is calculated by the logical simulation. The logical primitive means that each element in the logic circuit is abstractedly represented by those logic operating characteristics, but not by those physical structures. For example, it is represented by an inverter for inverting a signal, an AND circuit for operating logical product, an OR circuit for operating logic sum and the like. In this embodiment, the logical primitive is specified by the characteristic of CMOS circuit, and state-transited information or toggle information in the logic circuit is determined by using the logical primitive in performing the logical simulation. Also, the detection at a time of causing a state transition or a leading edge has two cases such as use of an output signal and of an input signal, in this case.

In addition, when calculating the power consumption of logic circuit, a power calculation parameter is determined in response to a measured value or logical value of input and output signals each associated with the logical primitives as to a unit of the logical primitive. Thereby, the power consumption of logical primitives is determined by a library of the power consumption for each of the logical primitives. The power consumption library is referred with the toggle information determined by the logical simulation to thereby determine the power consumption for each of the logical primitives. Each power consumption of the logical primitives is then summed up to determine a total power consumption for an entire logic circuit.

Referring to FIG. 2, a power consumption library 2 will be described below as to how to produce the library in this embodiment. The power consumption library 2 is produced by the power consumption library producing part 1 shown in FIG. 1 in order to calculate the power consumption for each of the logical primitives with the logical simulation applied.

In Step S1, to begin with, a combination of input signals causing power consumption due to the state transition of output signals is defined for a practical device or device model of each logical primitive stored in the device information storing file 11. In Step S2, an exclusive identifier ID is set for each defined combination of the input signals. In Step S3, a load capacitance is set for each combination having the identifier ID of the input signals by singular or plural arbitrary number of stages in the device measuring and simulating part 12. A value of power consumption for each of the logical primitives are then determined by either a practical measurement or device simulation at the stages having the load capacitance values. In Step S4, a look-up table for each power consumption value of the load capacitance values is then produced in accordance with the determined power consumption, which is stored in the power consumption look-up table storing file 13 as a library for each of the identifiers IDs. With Such steps repeatedly carried out, in Step S5, the look-up table for each of the identifier IDs is produced and is used as power consumption library 2 for the logical primitives.

Next, a power consumption calculating model will be described below in calculating the power consumption for the logical primitive. Assuming that a logical primitive A shown in FIG. 3 is a logical primitive used for calculating the power consumption, the power consumption at a time of the state transition in the logical primitive A is dependently determined by the charge and discharge currents in relation to an output wiring capacitance Cn of the logical primitive A and input terminal capacitance Cb, Cc and Cd for logical primitives B, C and D present in the succeeding stage of the logical primitive A.

Moreover, when determining the value of power consumption for the logical primitive, a driving force or internal load should be considered that it is altered with the state transition of input and output signals. As shown in FIG. 4, for example, the power consumption of a logical primitive L1 made up of an AND gate a1 and OR gate o1 is altered with a driving state of each gate therein.

Assuming that the state alters from "0" to "1" at an output out1 in logical primitive L1, the power consumption may be considered of three cases in correspondence with inputs in1, in2 and in3.

(1) Power consumption P11 which is based on the state transition from "0" to "1" at the output out1 caused by the state transition from "0" to "1" at the input in1.

(2) Power consumption P21 which is based on the state transition from "0" to "1" at the output out1 caused by the state transition from "0" to "1" at the input in2.

(3) Power consumption P31 which is based on the state transition from "0" to "1" at output out1 caused by the state transition from "0" to "1" at the input in3.

In the case of logical primitive L1 shown in FIG. 4, the three-power consumption described above is apparently represented by an expression P11=P21>P31. The power consumption of logical primitive is altered with the state transition of input signals even though the input signals are altered with the same state transition in a logical primitive. Thus, with the combination of input signals also considered in the logical primitive, a power calculation model can be produced so that it is realized with a nearly practical model for performing a practical operating state. In short, it is required that the combination state of input signals in the logical primitives should be considered of producing the power consumption library.

Hereinafter, a producing example of the power consumption look-up table will be described with reference to FIGS. 5(a) and 5(b).

FIGS. 5(a) and 5(b) show a first producing example of the power consumption look-up table. A logical primitive L2 shown in FIG. 5(a) is an inverter i1, and there are two state transitions of such an input signal in1 and output signal out1.

(1) A first state transition from "0" to "1" at the output out1 based on the state transition from "1" to "0" at the input in1.

(2) A second state transition from "1" to "0" at the output out1 based on the state transition from "0" to "1" at the input in1.

According to such state transition, identifier ID is set to as follows.

(1) The identifier ID is set to "0" in the case of the first state transition.

(2) The identifier ID is set to "1" in the case of the second state transition.

When the identifier ID is "0", the relationship or operating characteristic between a load capacitance C and power consumption P shown in FIG. 5(b) is determined by the measurement or device simulation. The values of power consumption P1, P2, P3 and P4 are then obtained from the operating characteristic in accordance with the values of capacitance C1, C2, C3 and C4. Thereby, a load capacitance to power consumption look-up table is produced for the logical primitive L2 when the identifier ID is "0".

When the identifier ID is "1", the load capacitance to power consumption look-up table may also be produced with the same manner as is the case where the identifier ID is "0". As a result, a power consumption look-up table for the logical primitive L2 is completed.

FIGS. 6(a) and 6(b) show a second producing example of the power consumption look-up table. A logical primitive L3 shown in FIG. 6(a) is constituted of an AND gate a2 and an OR gate o2. The state transitions of an output out1 and inputs in1, in2 and in3 are shown in a table of FIG. 6(b) in which a character R denotes Rise (or state transition from "0" to "1") and F denotes Fall (or state transition from "1" to "0"). A symbol "–" denotes no-relation to the state transitions of input signals (or "do not care"). Identifiers IDs are then set to each of the state transitions shown in FIG. 6(b), and a load capacitance to power consumption look-up table is produced for each of the identifiers IDs.

Subsequently, a power consumption calculating method will be described below, in which the calculation for a logic circuit with the logical simulation applied is conducted by the power consumption calculating apparatus shown in FIG. 1.

Referring back to FIG. 1, the logic circuit information file 3 stores information for the logical primitives constituting logic circuits and information of those connection states. With the two-information supplied from the logic circuit information file 3, the capacitance estimating tool 4 estimates those values of load capacitance in the plural stages at each of the logical primitives constituting the logic circuit, thereby storing the estimated values of load capacitance in the load capacitance file 5.

Further, with the information for the logical primitives, information of those connection states and information having the input signal types emerged on each input terminal of the logical primitives are stored in the input signal type information file 6. The logical simulator 7 then conducts a logical simulation for the logic circuit with those information used. As a result of the logical simulation, in Step P1, toggle information is obtained as indicated state transitions for each of the logical primitives, as shown in FIG. 7. An identifier ID defined in the power consumption library 2 is determined in accordance with those state transitions of input and output signals for each of the logical primitives of logic circuit in Step P2, storing the identifier ID in the simulated result storing file 8.

In the power consumption calculating tool 9, the ID collecting part 91 collects the identifiers IDs at each state transition of the input and output signals up to the end of logical simulation to produce state-transited information of the identifiers IDs in time series, in Step P3. In response to the identifiers IDs and the values of load capacitance at every logical primitive, the power consumption calculating part 92 refers to the power consumption information for each of the logical primitives previously provided in the power consumption library 2. The power consumption calculating part 92 then calculates power consumption for each of the logical primitives in Step P4. Thereby, the determined value of power consumption for each of the logical primitives is summed up to obtain the total value of power consumption for the logic circuit, and the total value thereof is stored in the calculated power consumption storing file 10.

A first calculation example of the power consumption will be described with reference to FIGS. 8(a) and 8(b). The first calculating example is used for determining power consumption at the state transition of every output signal (or leading and trailing edges).

FIG. 8(a) shows a logic circuit X1 constituted of a logical primitive a as an inverter i2 and a logical primitive b as an AND gate a3 and OR gate o3. For such logic circuit X1 with reference to FIG. 8(b), a logical simulation is conducted with use of input signals in1, in2 and in3. A result of the logical simulation is then obtained for an output signal out1 of the logical primitive a and an output signal out2 of the logical primitive b. With the logical simulation result traced back to the waveforms, identifiers IDs are determined at the leading and trailing edges indicative of times T1, T2, T3, T4, T5 and T6 for each of the output signals out1 and out2, as shown in FIG. 8(b).

Referring to FIG. 8(b), the identifiers IDs or identification transition information for the logical primitive a are therefore obtained for the output signal out1 as arrows indicated on the leading and trailing edges, that is, "1" at the time T1, "0" at the time T4, and "1" at the time T6. The identifiers IDs or identification transition information for the logical primitive b are also obtained for the output signal out2 as arrows indicated thereon, that is, "0" at the time T1, "1" at the time T2, "0" at the time T3, "1" at the time T4 and "0" at the time T5.

According to the identification transition information obtained above, the value of power consumption for each of the logical primitives is calculated from the value of load capacitance (or wiring capacitance and input terminal capacitance) which is previously determined. In addition, the sum of power consumption is also determined from each value of power consumption for the logical primitives to thereby obtain an entire power consumption of the logic circuit X1.

A second calculation example of the power consumption will be described with reference to FIG. 9. The second calculating example is used for determining power consumption for predetermined time intervals, but not for the leading and trailing edges of input signal.

As is also used the logic circuit X1 in the second calculation example, identifiers IDs or identification transition information are determined at the leading and trailing edges indicative of times T1, T2, T3, T4, T5 and T6 for each of the output signals out1 and out2. This is the same manner as first calculation example described above with reference to FIG. 8(b).

FIG. 9 shows input and output waveforms indicating times ta, tb, tc, td and te with equal time intervals. Power consumption distribution for each of the time intervals between ta and tb, tb and tc, tc and td, and td and te is obtained from the identification transition information for each of the times T1, T2, T3, T4, T5 and T6. For example, the power consumption of the time interval between ta and tb is obtained from the power consumption corresponding to the identification transition information "1" at the time T1 and "0" at the time T1. The power consumption of the time interval between tb and tc is obtained from the power consumption corresponding to the identification transition information "1" at the time T2 and "0" at the time T3. The power consumption of the time interval between tc and td is obtained from the power consumption corresponding to the identification transition information "0" at the time T4, "1" at the time T4 and "0" at the time T5. The power consumption of the time interval between td and te is then obtained from the power consumption corresponding to the identification transition information "1" at the time T6.

As described above, the produce of power consumption library 2 is explained with reference to the flow chart illustrated on FIG. 2 and the power consumption calculating method is also explained with reference to the flow chart illustrated on FIG. 7. These flow charts briefly represent the process of computer programs that are executed in a previously incorporated processor of the apparatus.

According to the power consumption calculating apparatus describe above, the power consumption for integrated circuit made up of CMOS device can be obtained from the logical simulation. Since the state transition is based on the calculation of power consumption in relation with the input and output terminals of logical primitive, there is an excellent affinity in association with the logical simulation. The power consumption information may be provided for other apparatuses to be required for such information since the power consumption calculation is carried out by the previously determined value of power consumption and toggle information in response to the state transitions for each of the logical primitives. This provides a flexible power consumption calculating manner such that a logical simulation is not required repeatedly for a case of changing the power consumption value, wiring capacitance and the like. The result of logical simulation represents as identification transition information, therefore, the power consumption may be analyzed in time series. More accurate power consumption calculation may also be carried out, and the number of toggle information can be extracted from the logic circuit. Furthermore, the integrated circuit is not only used with CMOS device, but also used with an integrated circuit made up of an internally high resistance device in non-conductive state.

It is thus apparent that the present invention is not limited to the above embodiments but may be changed and modified without departing from the scope and spirit of the invention.

Finally, the present application claims the priority of Japanese Patent Application No. Hei10-150013 filed on May 29, 1998, which is incorporated herein by reference.

What is claimed is:

1. A power consumption calculating apparatus comprising:
   a power consumption library adapted to store an estimated power consumption of at least one logical primitive comprising a logic circuit during a state transition of the logical primitive in correspondence with an identifier of a combination of signal states input to the logical primitive and a load capacitance for the logical primitive;
   a logic circuit information storage which stores structure information for the logical primitive and of a connection state between the logical primitives in the logic circuit;
   a capacitance storage which stores estimated load capacitance of the logical primitive in response to the logic circuit information;
   an input signal type storage which stores input signal type in the logic circuit;
   a logical simulator which performs a logical simulation using the structure information and the input signal type to determine state-transited information in the logical primitive to generate an identifier; and
   a power consumption calculator which collects the identifier from the logical simulator, determines a power consumption for the logical primitive with reference to the power consumption library in response to the state-transited information of the identifier and the load capacitance information, and sums the power consumption for at least the one logical primitive to determine a total power consumption of the logic circuit and to determine a power consumption for each time interval of an arbitrary time series different from a time series of the state-transited information in accordance with a result of a power consumption calculation.

2. The power consumption calculating apparatus of claim 1, wherein the logic circuit comprises a plurality of logical primitives.

3. The power consumption calculating apparatus of claim 1, wherein the logical primitive comprises a CMOS circuit.

4. The power consumption calculating apparatus of claim 3, wherein the load capacitance is estimated from an output wiring capacitance of the logical primitive and an input terminal capacitance of logical primitive in succeeding stages.

5. The power consumption calculating apparatus of claim 4, wherein the load capacitance is estimated for an arbitrary number of stages in a plurality of logical primitives.

6. The power consumption calculating apparatus of claim 5, wherein the power consumption calculator is adapted to determine a power consumption for the state-transited information obtained from the logical simulator, thereafter.

7. A power consumption calculating apparatus, comprising:

a library adapted to determine a power consumption for at least one logical primitive during transition of input signals inputted to the logical primitive constituting a logic circuit and to store the power consumption in correspondence with state transitions of the input signals; and a power consumption summer adapted to identify the state transition of the input signal inputted to the logical primitive in accordance with a result of a logical simulation to read out the power consumption from the library, to determine a power consumption for the logical primitive to sum up the determined power consumption for the logic circuit, and to determine a power consumption for each time interval of an arbitrary time series different from a time series of the state-transited information in accordance with a result of a power consumption calculation.

8. A power consumption calculating method, comprising:

(a) providing a power consumption library adapted to store a power consumption of at least one logical primitive comprising a logic circuit during a state transition of the logical primitive in correspondence with an identifier of a combination of signal states input to the logical primitive and a load capacitance for the logical primitive;

(b) estimating load capacitance information for the logical primitive based upon structure information of the logical primitive and upon a connection state of the logical primitive in the logic circuit;

(c) carrying out a logical simulation based upon the structure information and an input signal type information to determine state-transited information in the logical primitive to generate an identifier;

(d) collecting the identifier obtained from a result of the logical simulation for the logical primitive comprising the logic circuit;

(e) determining a power consumption for the logical primitive with reference to the power consumption library in response to the state-transited information of the identifier and the load capacitance information;

(f) summing the power consumption for at least the one logical primitive to determine a total power consumption of the logic circuit; and (g) determining the power consumption for each time interval of an arbitrary time series different from a time series of the state-transited information in accordance with the result of the power consumption calculation.

9. The power consumption calculating method of claim 8, wherein the logic circuit includes a plurality of logical primitives.

10. The power consumption calculating method of claim 8, wherein the logical primitive comprises a CMOS circuit.

11. The power consumption calculating method of claim 8, wherein the load capacitance is estimated from an output wiring capacitance of the logical primitive and an input terminal capacitance of logical primitives in succeeding stages, in the step (b).

12. The power consumption calculating method of claim 10, wherein the load capacitance is estimated for an arbitrary number of stages in a plurality of logical primitives.

13. The power consumption calculating method of claim 8, wherein the power consumption is determined for the state-transited information obtained from a result of the logical simulation, thereafter.

14. A power consumption calculating method, comprising:

determining a power consumption for at least one logical primitive during a state transition of input signals inputted to the logical primitive comprising a logic circuit and storing the power consumption in a library in correspondence with the state transition of the input signals;

identifying the state transition of the input signal inputted to the logical primitive in accordance with a result of a logical simulation in the logic circuit;

reading out the power consumption corresponding to the state transition from the library, determining power consumption for the logical primitive, and determining power consumption of the logic circuit in accordance with the power consumption determined for at least the one logical primitive; and determining the power consumption for each time interval of an arbitrary time series different from a time series of the state-transited information in accordance with the result of the power consumption calculation.

15. The power consumption calculating method of claim 14, wherein the logic circuit includes a plurality of logical primitives.

* * * * *